US00RE43948E

(19) United States
(12) Reissued Patent
Puhakka et al.

(10) Patent Number: US RE43,948 E
(45) Date of Reissued Patent: Jan. 29, 2013

(54) FORMATION OF CONTACTS ON SEMICONDUCTOR SUBSTRATES

(75) Inventors: Kimmo Puhakka, Espoo (FI); Ian Benson, Church Crookham (GB)

(73) Assignee: Siemens Aktiengesellschaft, Munich (DE)

(21) Appl. No.: 12/978,401

(22) Filed: Dec. 23, 2010

Related U.S. Patent Documents

Reissue of:

(64) Patent No.: 7,767,487
Issued: Aug. 3, 2010
Appl. No.: 10/532,118
PCT Filed: Oct. 23, 2003
PCT No.: PCT/GB03/04577
§ 371 (c)(1),
(2), (4) Date: Nov. 15, 2006
PCT Pub. No.: WO2004/038809
PCT Pub. Date: May 6, 2004

(30) Foreign Application Priority Data

Oct. 23, 2002 (GB) ..... 0224689.0

(51) Int. Cl.
*H01L 21/00* (2006.01)
*H01L 21/82* (2006.01)
*H01L 21/44* (2006.01)

(52) U.S. Cl. ..... 438/98; 438/669; 438/128; 438/614; 438/83

(58) Field of Classification Search ..... 438/98, 438/57, 84, 102, 930, 958, 128, 83, 669, 438/22, 25, 26, 618, 625, 631, 637, 645, 438/614, 626
See application file for complete search history.

(56) References Cited

U.S. PATENT DOCUMENTS

| | | | |
|---|---|---|---|
| 4,106,046 | A | 8/1978 | Nathanson et al. |
| 4,142,199 | A | 2/1979 | Simi et al. |
| 4,188,709 | A | 2/1980 | Lorenze, Jr. et al. |
| 4,239,312 | A | 12/1980 | Myer et al. |
| 4,257,057 | A | 3/1981 | Cheung et al. |
| 4,369,458 | A | 1/1983 | Thomas et al. |
| 4,513,312 | A | 4/1985 | Takemura |
| 4,602,289 | A | 7/1986 | Sekine |

(Continued)

FOREIGN PATENT DOCUMENTS

| | | |
|---|---|---|
| EP | 0 415 541 | 3/1991 |
| EP | 0 415 541 A1 | 3/1991 |

(Continued)

OTHER PUBLICATIONS

P. Annala, J. Kaitila, J. Salonen, Electroplated Solder Alloys for Flip chip Interconnections, Physica Scripta. vol. T69, 115-118, 1997.

(Continued)

*Primary Examiner* — Chuong A. Luu
(74) *Attorney, Agent, or Firm* — Harness, Dickey & Pierce, P.L.C.

(57) ABSTRACT

Embodiments of the invention are concerned with a method of manufacturing a radiation detector having one or more conductive contacts on a semiconductor substrate, and comprise the steps of: applying a first conductive layer to a first surface of the semiconductor substrate; applying a second conductive layer to form a plurality of contiguous layers of conductive materials, said plurality of contiguous layers including said first conductive layer; and selectively removing parts of said plurality of contiguous layers so as to form said conductive contacts, the conductive contacts defining one or more radiation detector cells in the semiconductor substrate.

14 Claims, 7 Drawing Sheets

U.S. PATENT DOCUMENTS

| | | | |
|---|---|---|---|
| 4,609,823 | A | 9/1986 | Berger et al. |
| 4,694,316 | A | 9/1987 | Chabbal |
| 4,744,057 | A | 5/1988 | Descure et al. |
| 4,811,371 | A | 3/1989 | Tower |
| 4,817,123 | A | 3/1989 | Sones |
| 4,873,708 | A | 10/1989 | Cusano et al. |
| 4,900,943 | A | 2/1990 | Marshall et al. |
| 4,916,664 | A | 4/1990 | Berger et al. |
| 4,945,243 | A | 7/1990 | Arques |
| 4,947,258 | A | 8/1990 | Hersh |
| 4,992,878 | A | 2/1991 | Hersh |
| 5,012,247 | A | 4/1991 | Dillman |
| 5,043,582 | A | 8/1991 | Cox et al. |
| 5,081,346 | A | 1/1992 | Narabu et al. |
| 5,113,263 | A | 5/1992 | Audaire et al. |
| 5,149,954 | A | 9/1992 | Pettijohn et al. |
| 5,153,420 | A | 10/1992 | Hack et al. |
| 5,168,528 | A | 12/1992 | Field, Jr. |
| 5,182,624 | A | 1/1993 | Tran et al. |
| 5,245,191 | A | 9/1993 | Barber et al. |
| 5,291,402 | A | 3/1994 | Pfoh |
| 5,315,114 | A | 5/1994 | Kansy et al. |
| 5,315,147 | A | 5/1994 | Solomon |
| 5,315,411 | A | 5/1994 | Blanding |
| 5,379,336 | A | 1/1995 | Kramer et al. |
| 5,401,952 | A | 3/1995 | Sugawa |
| 5,402,168 | A | 3/1995 | Fouilloy |
| 5,475,212 | A | 12/1995 | Nelson et al. |
| 5,526,394 | A | 6/1996 | Siczek et al. |
| 5,587,738 | A | 12/1996 | Shinohara |
| 5,596,200 | A | 1/1997 | Sharma et al. |
| 5,742,058 | A | 4/1998 | Pantigny et al. |
| 5,812,191 | A | 9/1998 | Orava et al. |
| 5,917,881 | A | 6/1999 | Jeffery |
| 5,937,326 | A | 8/1999 | Cho |
| 5,998,777 | A | 12/1999 | Audier et al. |
| 6,014,313 | A | 1/2000 | Hesselbom |
| 6,035,013 | A | 3/2000 | Orava et al. |
| 6,046,068 | A | 4/2000 | Orava et al. |
| 6,188,089 | B1 * | 2/2001 | Spartiotis ..... 257/188 |
| 6,215,123 | B1 * | 4/2001 | Orava et al. ..... 250/370.13 |
| 6,248,990 | B1 | 6/2001 | Pyythia et al. |
| 6,262,421 | B1 | 7/2001 | Tran |
| 6,278,181 | B1 | 8/2001 | Maley |
| 6,459,077 | B1 | 10/2002 | Hynecek |
| 6,563,539 | B1 | 5/2003 | Lefevre |
| 6,645,787 | B2 | 11/2003 | Nemirovsky et al. |
| 6,952,042 | B2 | 10/2005 | Stratton et al. |
| 2002/0036269 | A1 | 3/2002 | Shahar et al. |
| 2002/0130266 | A1 | 9/2002 | Kyyhkynen |
| 2002/0180063 | A1 | 12/2002 | Iwaki et al. |
| 2003/0155516 | A1 | 8/2003 | Spartiotis et al. |
| 2004/0069213 | A1 | 4/2004 | Bourgoin |

FOREIGN PATENT DOCUMENTS

| | | | |
|---|---|---|---|
| EP | 0556820 | A1 | 2/1993 |
| EP | 0 635 892 | A1 | 1/1995 |
| EP | 0660600 | B1 | 3/1999 |
| EP | 1 001 469 | A2 | 5/2000 |
| EP | 1 063 709 | A2 | 12/2000 |
| EP | 1 176 814 | A2 | 1/2002 |
| EP | 1207559 | A2 | 5/2002 |
| EP | 1237197 | A2 | 9/2002 |
| GB | 2318411 | A1 | 4/1998 |
| GB | 2323736 | A1 | 9/1998 |
| GB | 2343577 | A1 | 5/2000 |
| JP | 60-10735 | | 1/1985 |
| JP | 01200720 | | 8/1989 |
| JP | 3-188684 | | 8/1991 |
| JP | 9-83007 | | 3/1997 |
| JP | 9-83008 | | 3/1997 |
| JP | 02-040968 | | 2/2002 |
| JP | 2002311146 | | 10/2002 |
| JP | 2003-142673 | | 5/2003 |
| WO | WO 98/16853 | A1 | 4/1998 |
| WO | WO 01/01486 | A1 | 1/2001 |
| WO | WO 01/08224 | A1 | 2/2001 |

OTHER PUBLICATIONS

J. Breibach, K. Lübelsmeyer, TH. Mäsing, C. Rente, Development of a Bump Bonding Interconnect Technology for GaAs Pixel Detectors, Nuclear Instruments and Methods in Physics Research, Section A, vol. 470, 576-582, 2001.

M. Lozano, E. Cabruja, A. Collado, J. Santander, M. Ullán, Bump Bonding of Pixel Systems, Nuclear Instruments & Methods in Physics Research, Section A, vol. 473, 95-101, 2001.

Third Party Observations Submitted to the Japanese Patent Office related to Japanese Application No. 2004-546176.

Japanese Office Action dated May 17, 2011, issued in corresponding Japanese Application No. 2004-546176.

* cited by examiner

FORMATION OF CONTACTS ON SEMICONDUCTOR SUBSTRATES

Matter enclosed in heavy brackets [ ] appears in the original patent but forms no part of this reissue specification; matter printed in italics indicates the additions made by reissue.

This is a 371 national phase application of PCT/GB2003/004577 filled 23 Oct. 2003, claiming priority to GB Application No. 0224689.0 filed 23 Oct. 2002, the contents of which are incorporated herein by reference.

FIELD OF THE INVENTION

The invention relates to methods of manufacturing radiation detectors and radiation imaging devices, radiation detectors and imaging devices manufactured by these methods and the use of such imaging devices.

BACKGROUND OF THE INVENTION

A radiation detector for an imaging device typically comprises a semiconductor substrate with a pattern or array of conductive contacts on one surface of the substrate defining an arrangement of detector cells.

Various semiconductor materials can be used in radiation detectors. For example, for optical wavelengths and charged radiation (beta-rays), silicon has typically been used for the semiconductor substrate material, while cadmium zinc telluride (CdZnTe), cadmium telluride (CdTe), titanium bromide (TiBr), mercury iodide (HgI) and gallium nitride (GaN) can be used as substrate material in X-ray, gamma-ray and to a lesser extent beta-ray radiation imaging.

Such detector substrates need to be processed to produce a detector having a pattern of conductive contacts (e.g. pixel pads) on one surface, so that the detector may be position sensitive; that is, to ensure that the detector can produce a detector output indicating the position at which radiation impacts the detector. A readout chip then can be 'flip-chip' joined to the patterned side of the detector (e.g., by bump bonding using low temperature soldering with tin lead bismuth (PbSnBi) alloy solder or using balls of indium or conductive polymer material, gluing using conductive materials or other conductive adhesive layer techniques) so that the position dependent electrical signals which result from incidence and absorption in the detector cells of beta-rays, X-rays or gamma-rays for example, can be processed.

In some known radiation detectors, problems have been observed with certain characteristics of the conductive contacts. These include the conductive contacts having poor adhesion properties and shorter than desired life times. Shorter than desirable life times have been observed when radiation detectors are joined to a readout chip in a radiation imaging device, via a bump bonding technique using either a lead-based or a lead-free solder, for example.

It is therefore desirable to provide a method that produces radiation detectors with improved electrical properties.

SUMMARY OF THE INVENTION

In accordance with one aspect of the invention, there is provided a method of manufacturing a radiation detector having one or more conductive contacts on a semiconductor substrate, the method including the steps of:

applying a first conductive layer to a first surface of the semiconductor substrate;

applying a second conductive layer to form a plurality of contiguous layers of conductive materials, said plurality of contiguous layers including said first conductive layer; and selectively removing parts of said plurality of contiguous layers so as to form said conductive contacts, the conductive contacts defining one or more radiation detector cells in the semiconductor substrate.

In one arrangement the first layer is a contact layer and the second layer is a diffusion barrier layer, which means that embodiments can provide particularly good chemical contact with the substrate (via the contact layer) and improved lifetime (via the diffusion barrier layer). In some embodiments the conductive contacts additionally include either or both of a third conductive layer and a further conductive layer, the third being sandwiched between the first and second layers and the further being adjacent the second layer. The third layer acts as an adhesion layer, whilst the further layer acts as a wetting agent for the bump bonding. Advantageously, the diffusion barrier (second) layer prevents bump bond material (e.g. PbSnBi solder) from diffusing into layers beyond the diffusion barrier layer, which is detrimental to the lifetime of the detector.

Preferably, the conductive layers are applied by methods such as sputtering, evaporation, electrolytic deposition, or electroless deposition (e.g. chemical deposition), before any subsequent layers are formed. An advantage of forming the plurality of contiguous layers of conductive materials first (i.e. before applying an insulating layer such as a passivation layer) is that this can improve electrical contact characteristics, reduce hotspots, improve yield and improve detector quality. Homogenous contacts with even electrical contacts can thus be reliably produced.

In one arrangement, the method of forming the plurality of contiguous layers of conductive materials involves:

(a) forming a layer of photoresistive material on said substrate surface;

(b) selectively exposing said photoresistive material and removing said photoresistive material from areas corresponding to said contact positions to expose said semiconductor substrate surface;

(c) applying said plurality of layers of conductive materials on remaining photoresistive material and on said exposed semiconductor substrate surface; and (d) removing conductive material overlying said remaining photoresistive material by removing said remaining photoresistive material (this process being commonly called "lift-off").

The surface resistivity of cadmium-based substrates in particular, for example a CdZnTe semiconductor substrate, is degraded when the substrate is exposed to metal etchants suitable for removing gold and/or platinum, for example. As a result of this, the electrical separation of the individual contacts which result from some known methods of forming such contacts is not as good as would be expected from the properties of that material before treatment. By using a lift-off method in accordance with the invention, metal etchants need not be used, thus avoiding the damage which would result if the metal etchants came into contact with the semiconductor surface.

Preferably the method includes forming a layer of passivation material on said conductive contacts and the regions around conductive contacts; and removing portions of said passivation material overlying said conductive contacts to expose the conductive contacts.

The removal of portions of said passivation material overlying said conductive contacts to expose the conductive contacts can involve: forming a further layer of photoresistive material over said passivation layer; selectively exposing regions of said further layer of photoresistive material; and removing portions of the further photoresistive material corresponding to the exposed regions so as to expose portions of said passivation layer corresponding to said contact positions. The exposed portions of passivation layer are then removed, and finally any remaining further photoresistive material is also removed.

An advantage of applying the further layer of photoresistive material is that areas of varying size, specifically, smaller or larger than the contact positions, can be exposed, which means that portions of the layer of passivation material can be removed from areas smaller than the conductive contacts. After this removal of portions of said passivation layer, the passivation material can overlap with the conductive contacts. This means that the passivation material may be applied over portions of the conductive contacts, providing good mechanical contact, and reducing the possibility of gaps being formed between the conductive material and passivation material.

In one arrangement, the further photoresistive material is removed from areas of passivation material in order to expose said areas in a desired pattern for forming conductive tracks.

To protect the other main surface and the sides (edges) of the semiconductor substrate, photoresistive material can additionally be applied to all exposed surfaces as well as the surface on which the conductive contacts are formed.

Preferably, the first and second layers comprise different metals, while the third and further layers comprise the same metal. For example, in one arrangement the contact (first) layer comprises platinum; the adhesion (third) layer comprises gold, the diffusion barrier (second) layer comprises nickel and the wetting agent (further) layer comprises gold.

Each conductive contact so formed can define a respective pixel cell of an array of pixel cells, or one of a plurality of strips arranged parallel to each other. Pixel contacts formed on detector substrate are preferably substantially circular and are arranged in a plurality of rows, more preferably with alternate rows preferably being offset from adjacent rows. In one arrangement, conductive contacts can be from about 5 μm to about 100 μm across with a pitch from about 7 μm to about 500 μm. Preferably, the conductive contacts are of the order of 15 μm across with a pitch of the order of 35 μm.

According to a second aspect of the invention there is provided a radiation detector having a semiconductor substrate, comprising:

a plurality of conductive contacts arranged along the semiconductor substrate, the conductive contacts defining one or more radiation detector cells in the semiconductor substrate, wherein each of the conductive contacts comprises a plurality of contiguous layers of conductive materials comprising a first conductive layer and a second conductive layer.

A radiation detector in accordance with this second aspect of the invention finds particular, but not exclusive, application for X-ray, gamma-ray and beta-ray imaging, and one particular embodiment of the invention can provide a method for manufacturing detectors (e.g. a cadmium based substrate such as CdTe or CdZnTe) with one side uniformly metallised with a metal such as indium or platinum and the other side patterned with conductive contacts structures (e.g. a platinum/gold/nickel/gold stack) in a manner that does not adversely affect the surface characteristics of the substrate around or in between the contacts. Thus, a method can be provided for creating conductive structures on one side of a detector, the method achieving inter-structure resistivity of the order of GΩ/square or tens or hundreds of GΩ/square. The conductive contact structures can be patterned to provide readout tracks, for example.

Preferably the radiation detector includes an electrically insulating passivation layer between contacts distributed on the semiconductor substrate, which enables the area between metal contacts to be protected, thus giving the detector stable performance over time and avoiding effects such as oxidation which increase the surface leakage current and decrease the inter-contact resistivity. Aluminium nitride (AlN) passivation has been found to be particularly effective when applied between gold contacts to protect the surface and enhance the electrical separation of the gold contacts. The passivation layer of aluminium nitride can be implemented at relatively low temperatures typically less than 100° C. By contrast, silicon oxide ($SiO_2$), which is typically used as a passivant for silicon (Si) semiconductors, needs temperatures in excess of 200° C. After exposure to these temperatures, CdZnTe would be unusable.

Embodiments in accordance with the present invention may be used to define areas or regions away from, yet operatively related to, contact positions. This is particularly advantageous and is intended for use in manufacturing high energy (IKeV) radiation imaging devices since it allows more complex conductive material patterns to be formed (e.g. for spatially off-setting a charge collection contact of a detector cell relative to a corresponding contact of a read-out substrate cell).

In accordance with another aspect of the invention, there is provided a radiation detector comprising a semiconductor substrate for detecting radiation with a plurality of conductive contacts for respective radiation detector cells on a first surface thereof and a layer of conductive material on a surface of said substrate opposite to said first surface, wherein the exposed width of a said conductive contact is smaller that the overall width of said contact adjacent said substrate, and wherein the conductive contacts comprise a plurality of contiguous metallic layers.

BRIEF DESCRIPTION OF THE DRAWINGS

Embodiments of the invention will be described hereinafter, by way of example only, with reference to the accompanying drawings in which.

DETAILED DESCRIPTION OF THE DRAWINGS

Figure 1A:
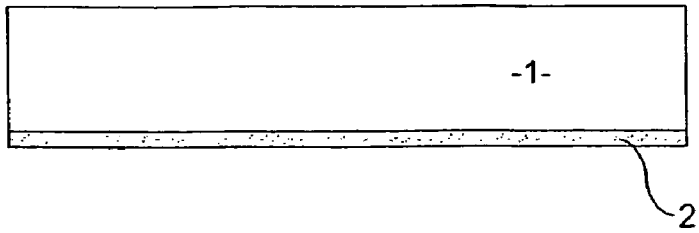
FIGS. 1A-1J are schematic diagrams showing an example of a method of forming metal contacts on a semiconductor substrate with a passivation layer between contacts according to an embodiment of the invention.
Figure 1B:
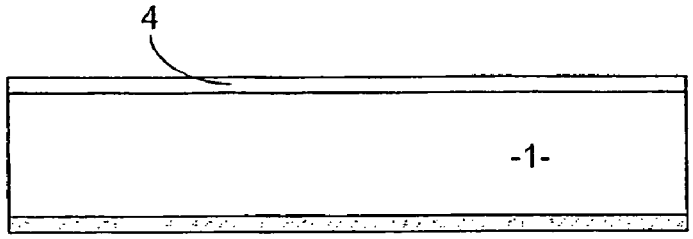
Figure 1C:
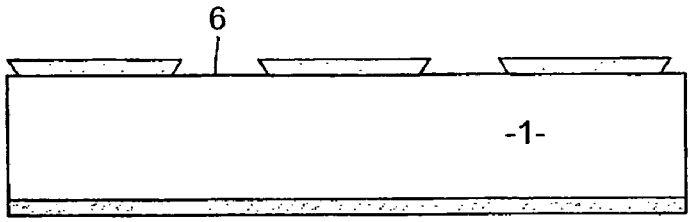
Figure 1D:
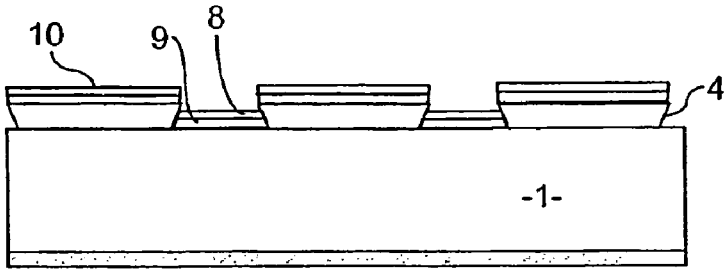
Figure 1E:
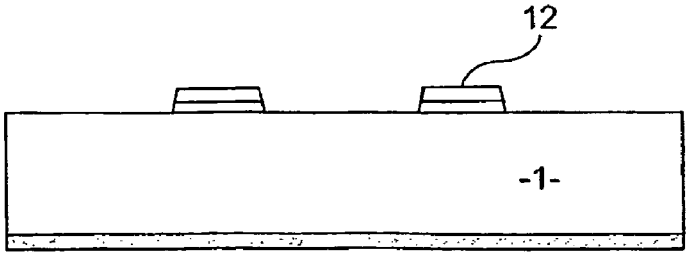
Figure 1F:
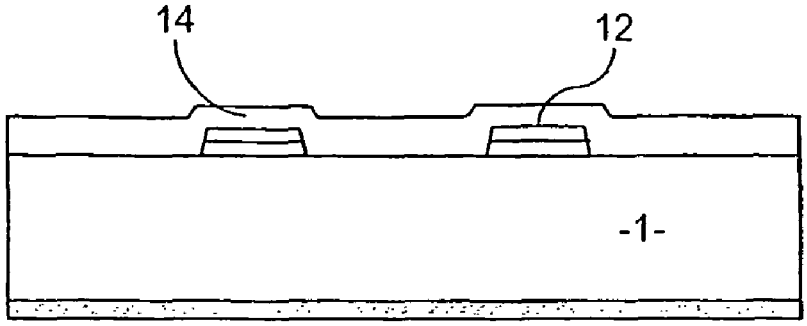
Figure 1G:
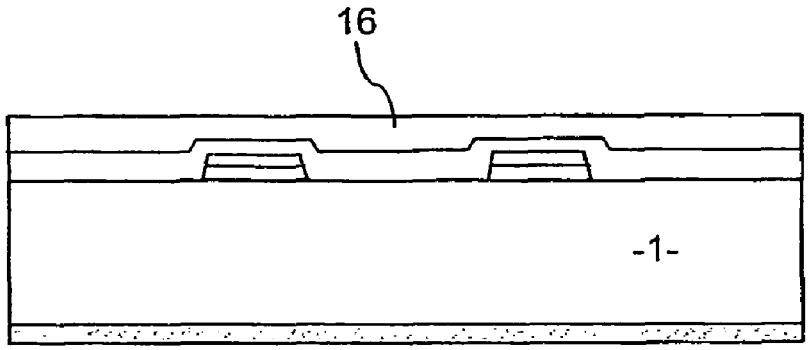
Figure 1H:
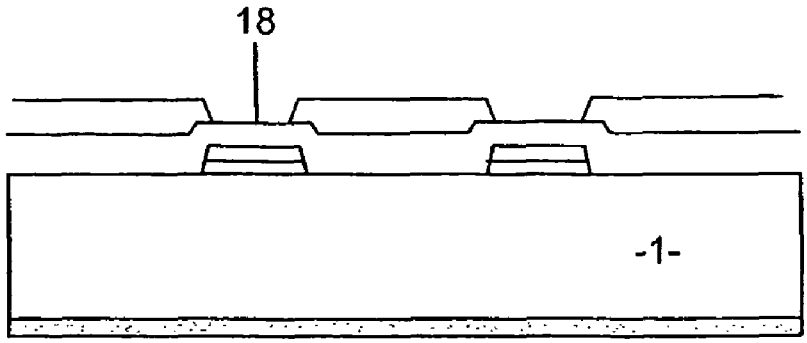
Figure 1I:
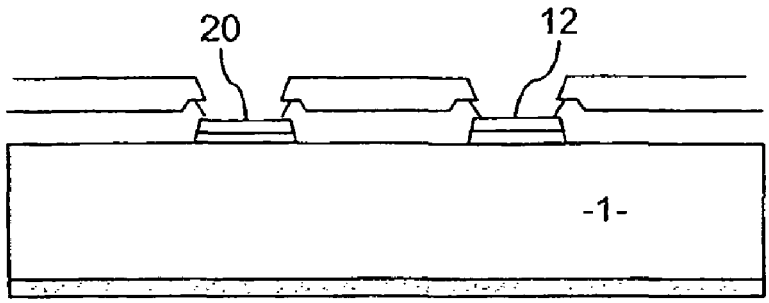

FIGS. 1A-1J show the steps involved in forming conductive contacts on a semiconductor substrate according to an embodiment of the invention. In the figure the contacts define discrete radiation detector cells, which have a layer of passivation material between the detector cells. The semiconductor substrate may be made of any suitable semiconductor material including, but not limited to, cadmium zinc telluride (CdZnTe), cadmium telluride (CdTe), lead iodide, thallium bromide, gallium arsenide or silicon. As shown in the Figures, the material used for the conductive layer and the contacts comprise a sequence or stack of layers of two or more different metals.

Each of FIGS. 1A-1J is a schematic cross-sectional view from the side of a detector substrate at various stages in the formation of conductive contacts on a semiconductor substrate.

Step A: One face (the lower face in FIG. 1) of the detector substrate 1 is uniformly metallised with conductive material 2.

Step B: Photoresistive material (photoresist) 4 is spun on a face opposing the face metallised in step A (the upper face in FIG. 1) of the detector 1 and preferably on the sides of the detector.

Step C: Openings 6 exposing the substrate surface are made in the photoresist 4 using an appropriate mask or other conventional technique for removing photoresist according to a desired pattern. The remaining photoresist is a negative profile of the positions for forming the conductive contacts and/or tracks (for a lift off process).

Step D: A plurality of layers 8, 9 of conductive material is sputtered, evaporated or laid by electrolysis or electroless deposition (e.g. chemical deposition) uniformly over the exposed substrate surface (through openings 6) and the photoresist 4, as a result of which the conductive material covers the photoresist 4 and the exposed substrate surface.

Step E: The remaining photoresist is removed, e.g. by dissolving with a solvent such as acetone, thereby lifting off unwanted conductive material areas 10 to expose areas of the substrate surface between conductive contacts 12.

Step F: Passivation material 14 is sputtered over the exposed areas of the substrate surface and over the conductive contacts 12.

Step G: A further layer of photoresist 16 is spun on the passivation layer 14.

Step H: Photoresist layer 16 is removed in portions to expose portions 18 of the passivation layer overlying the conductive contacts. The removed portions of the photoresist layer 16 and consequently the exposed portions 18 are slightly smaller in area than the area of the conductive contacts 12.

Step I: Openings 20 are made through the exposed portions of the passivation layer with a passivation etchant (e.g. an aluminium nitride etchant) to expose the conductive contacts 12. The exposed area of the conductive contacts is slightly smaller than the entire available area of the upper surface of the conductive contacts 12 themselves.

Step J: The remaining photoresist is removed. The passivation material slightly overlaps the conductive contacts 12 (in regions 22), which means that the exposed area of each conductive contact 12 is smaller than the area of the contact 12 at the interface between the contact and the semiconductor substrate 1. These overlapping regions ensure that there are no gaps between the passivation material and the contacts 12. In the embodiment shown the passivation material extends up and onto the contacts.

In the described method photoresist may additionally be applied to the sides and/or the lower face of the detector to provide protection during the process described above (e.g. at step B); any additional photoresist on the sides can then be removed at a later stage (e.g. at step J).

Non-limiting examples of particular embodiments of the invention will now be described.

EXAMPLE 1

Figure 1J:
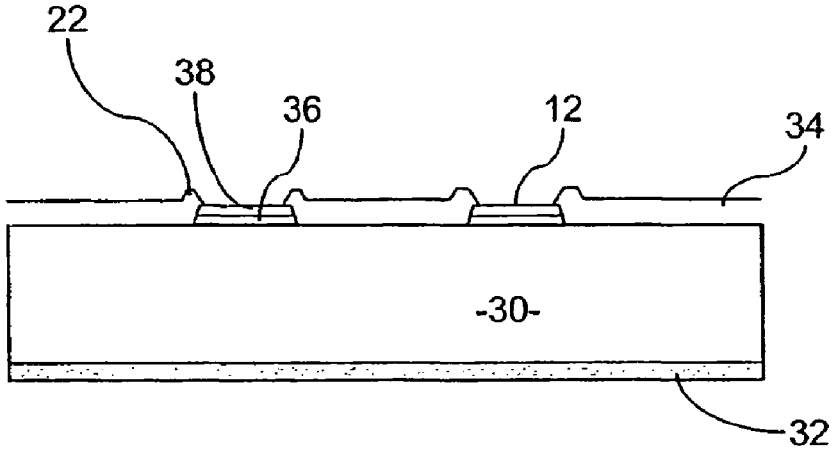

Referring to FIG. 1J, cadmium zinc telluride or cadmium telluride is used as the semiconductor substrate 1 and a platinum or indium metallisation layer is used as the conductive material 2 on the lower face of the detector in step A. The conductive layers 8, 9 in step D are formed by evaporation or electroless deposition of platinum and PVD sputtering of gold to form a stack or sequence of platinum and gold with the platinum formed on the substrate surface and the gold formed on the platinum. The passivation material 14 in step F is sputtered aluminium nitride formed by phase vapour deposition. In step I an alkali solution is used to etch the aluminium nitride.

The end result is a cadmium zinc telluride/cadmium telluride substrate 30, a platinum or indium layer 32, an aluminium nitride passivation layer 34, and conductive contacts formed as a stack of platinum and gold layers 36, 38.

EXAMPLE 2

Figure 2A:
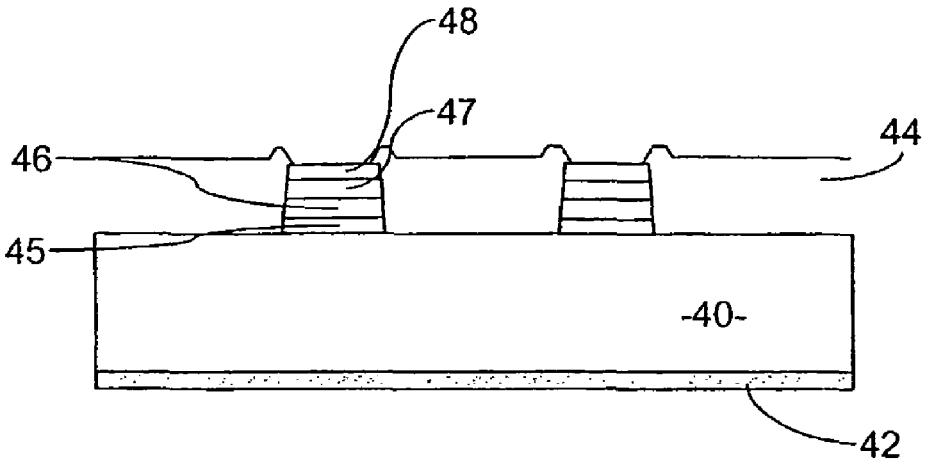
FIGS. 2A and 2B are schematic diagrams showing examples of detector substrates manufactured according to an embodiment of the invention.

Referring to FIG. 2A, cadmium zinc telluride or cadmium telluride is used as the semiconductor substrate 1, and an indium metallisation layer is used as the conductive material 2 on the lower face of the detector in step A. The conductive layers 8, 9 in step D form a stack of platinum, gold, nickel and gold. The passivation material 14 in step F is sputtered aluminium nitride formed by phase vapour deposition. In step I alkali solution is used to etch the aluminium nitride.

The end result is a cadmium zinc telluride/cadmium zinc substrate 40, an aluminium nitride passivation layer 44 and conductive contacts formed as a stack of platinum, gold, nickel and gold 45, 46, 47, 48.

EXAMPLE 3

This example corresponds to Example 2 except that the conductive contacts are formed as a stack of platinum 45, gold 46, indium 47 and gold 48.

EXAMPLE 4

Figure 2B:
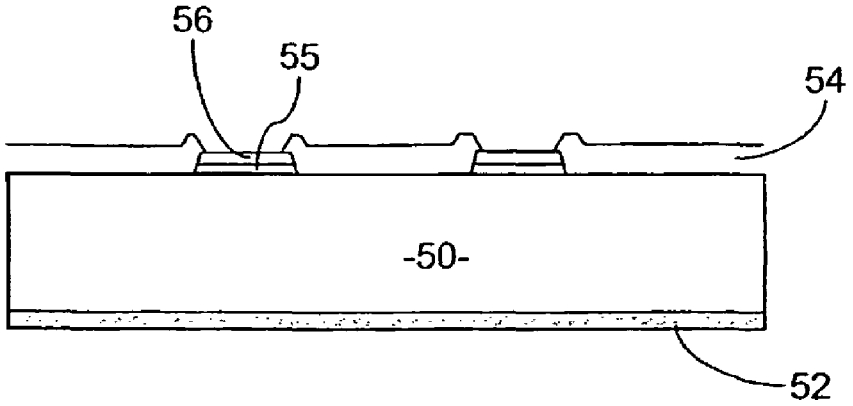

Referring to FIG. 2B, cadmium zinc telluride or cadmium telluride is used as the semiconductor substrate 1, and a platinum metallisation layer is used as the conductive material 2 on the lower face of the detector in step A. The conductive layers 8, 9 in step D comprise a stack of nickel and gold. The passivation material 14 in step F is sputtered aluminium nitride formed by phase vapour deposition. In step I alkali solution is used to etch the aluminium nitride.

The end result comprises a cadmium zinc telluride/cadmium zinc substrate 50, a platinum layer 52, an aluminium nitride passivation layer 54 and conductive contacts formed as a stack of nickel 55 and gold 56.

In other examples, stacks of platinum/gold/nickel; platinum/gold; indium/gold; chrome/copper/gold and platinum/titanium-tungsten alloy/gold are used.

Embodiments of the invention produce a detector with a lower face having a uniform conductive layer (e.g. a metallised layer such as a gold layer) and an upper face having conductive contacts in a desired pattern, and avoids the introduction of impurities from the passivation material and/or passivation etchant (e.g. aluminium nitride etchant) between the semiconductor substrate and the conductive contacts and into the conductive layer. The method eradicates the need to apply an etchant to the conductive layers (e.g. a gold etchant), and ensures that there is no contact between the passivation etchant and the substrate surface in the area between the conductive contacts or the edges and sides of the detector. As a consequence, the surface of the substrate between the conductive contacts remains unharmed, retaining very high resistivity of the order of GΩ/square, tens, hundreds or even thousands of GΩ/square and very low surface leakage current.

High resistivity between conductive contacts is desirable in order to achieve long integration standby or readout times of the signal created from impinging X-rays or gamma-rays, for example, without deterioration of the image resolution. By covering the areas between conductive contacts with passivation material (e.g. Aluminium nitride) the corresponding regions are protected from oxidation (providing stability over time), which enhances the inter-contact resistivity. Since the passivation material overlaps with the conductive contacts, there are no gaps on the semiconductor substrate surface, which increases the mechanical stability of the detector.

With the above described methods, contact pads up to about 100 μm across with up to about 500 μm pitch in between can be readily obtained, while retaining very high inter pixel resistivity.

Figure 3:
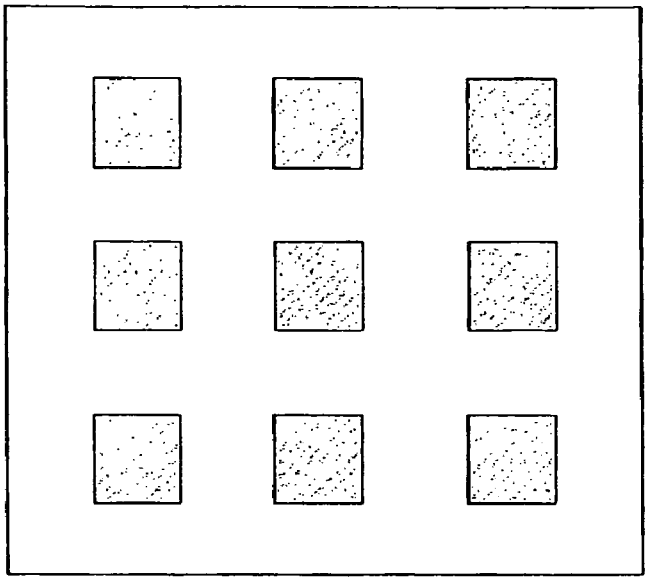
FIG. 3 is a schematic plan view of a contact configuration on a detector substrate.
Figure 4:
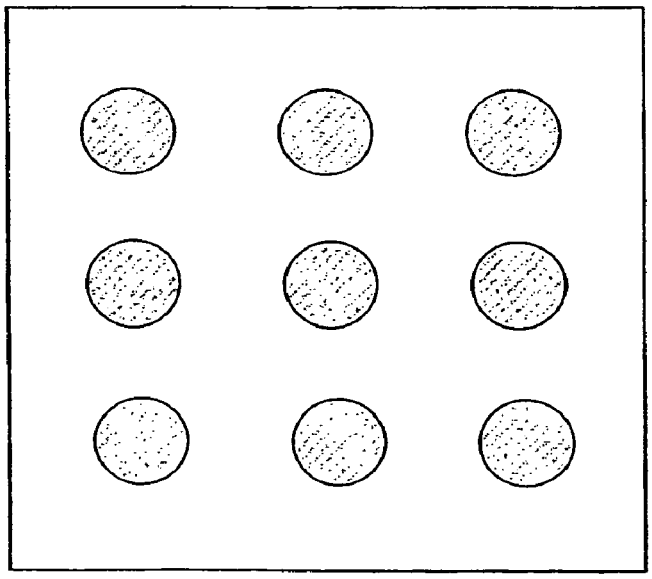
FIG. 4 is a schematic plan view of another contact configuration on a detector substrate.
Figure 5:
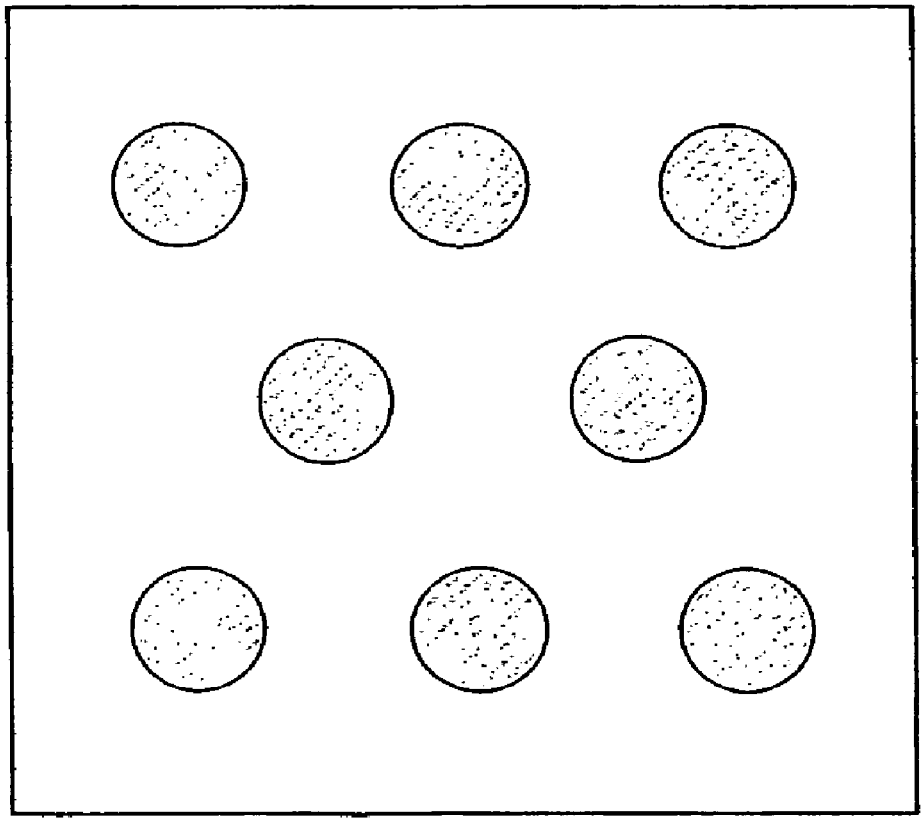
FIG. 5 is a schematic plan view of a further contact configuration on a detector substrate.

FIGS. 3, 4 and 5 illustrate possible contact patterns of metal contacts on the upper surface of the detector substrate. In FIG. 3, an array of square contact pads is shown, while FIG. 4 shows an array of circular contact pads. For any given size of metal contacts, the surface resistance between circular pads is greater than that between rectangular pads because the amount of resistive material between adjacent circular pads is greater. FIG. 5 illustrates an array of offset (honeycombed) pixel pads, and it can be seen that, in comparison with the regular spacing shown in FIG. 4, offsetting metal contacts with respect to one another increases the amount of resistive material between adjacent pads, thereby increasing the resistance between contacts.

It will be appreciated that rather than providing an array of contacts for defining an array of detector cells, other contact configurations, for example contact strips for defining strip-shaped detector cells, can be obtained with the same method.

Referring back to FIG. 1J, it can be seen that the metal contacts are not rectangular (the length of the contact, in a direction parallel to the plane of the substrate, of the exposed face is smaller than that of the face adjacent the substrate surface). This is due to the relative sizes of the openings to the contacts and of the contacts themselves and has the advantage that, when portions of the passivation material above the contacts are etched away, the etchant will not seep through to the interface between the passivation layer and the conductive contacts.

Figure 6:
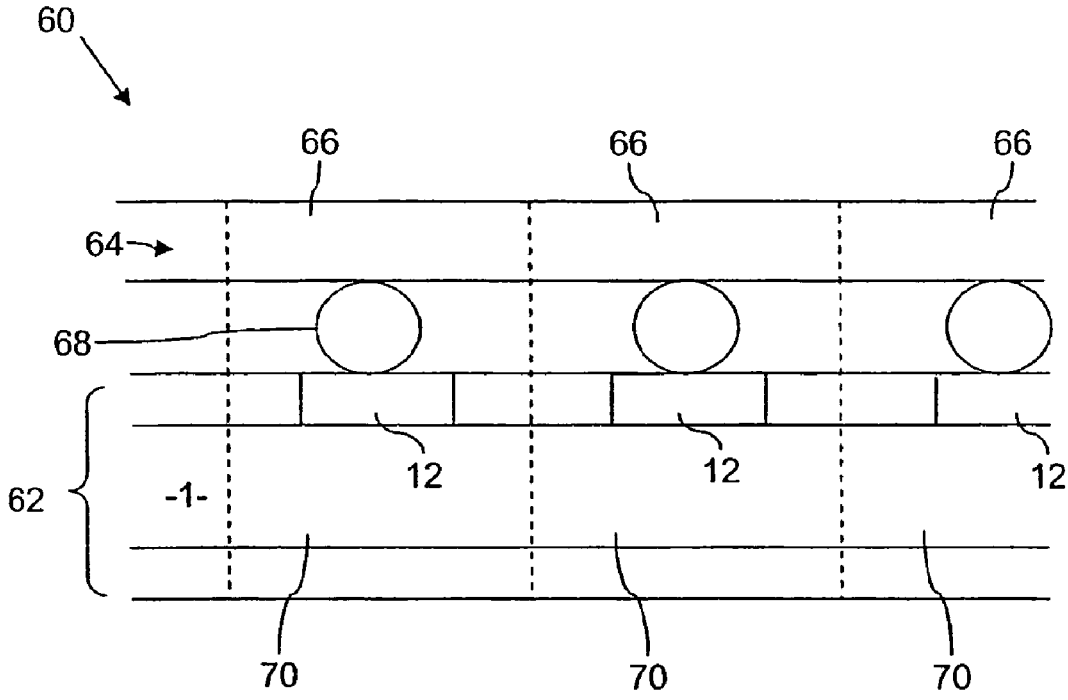
FIG. 6 is a schematic cross-section of a radiation imaging device manufactured according to an embodiment of the invention.

FIG. 6 is a schematic cross section of part of a radiation imaging device 60. Such radiation imaging devices are known and radiation detectors constructed in accordance with the embodiments of the present invention can be used within such a device. The radiation imaging device 60 comprises a radiation detector 62 and a readout chip 64 for reading charge from the conductive contacts 12 of the radiation detector 62. The radiation detector 62 comprises conductive contacts 12, which comprise a plurality of contiguous conductive layers, on one surface (the upper surface in FIG. 6) of a semiconductor substrate 1 and a layer of conductive material 2 on another surface (the lower surface in FIG. 6) of the semiconductor substrate 1. The readout chip 64 comprises circuitry for reading charge from the contacts 12 in the form of respective readout circuits 66. Readout circuits 66 are joined to respective contacts 12 via bonds 68 and may be 'flip-chip' joined (e.g., by bump bonding using low temperature soldering with tin lead bismuth (PbSnBi) alloy solder or using balls of indium or conductive polymer material, gluing using conductive materials, or other conductive adhesive layer techniques) to respective circuits.

The continuous conductive layer or electrode 2 and the conductive contacts 12 of the radiation imaging device 60 define detector cells 70. Corresponding readout circuits 66 for each detector cell are defined at locations corresponding to the detector cells 70. The readout circuits 66 are electrically connected to the corresponding contacts 12 by bonds 68 which form a conductive pathway. In this manner when charge is generated in a detector cell 70 in response to incident radiation, this charge is passed via the bond 68 to the corresponding readout circuit 66.

The readout chip may be any suitable readout chip. For example, the readout chip may be of the pulse counting type (e.g. photon counting) or one of the type which provides for charge accumulation for individual detector cells, such as that described in PCT/EP95/02056. In particular embodiments the readout chip may comprise one or more of: charge accumulation circuitry; counter circuitry; readout circuitry; energy discriminator circuitry; pulse shaping circuitry; pulse amplifying circuitry; analogue to digital converter circuitry; or rate divider circuitry.

Thus, the invention teaches how to obtain a radiation detector (e.g. based on a CdZnTe substrate) with one side metallised according to a desired pattern with maximum possible electrical resistivity separation between the metal contacts. High resistivity between metal contacts is desirable to improve contrast resolution and eliminate signal leakage between adjacent metal contacts on the substrate surface. This is particularly relevant when long charge accumulation times and long standby/readout times are employed by the readout chip. Such accumulation and standby/readout times could, for example, be in excess of 1 msec in examples of imaging devices using a radiation detector manufactured in accordance with the present invention. Such imaging devices find application, for example, for X-ray, gamma-ray and beta-ray imaging as described in the applicant's International Patent Application PCT/EP 95/02056 incorporated herein by reference.

Although particular embodiments of the invention have been described by way of example, it will be appreciated that additions, modifications and alternatives thereto may be envisaged.

The present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

The invention claimed is:

1. A method of manufacturing a radiation detector having one or more conductive contacts on a semiconductor substrate, *the one or more conductive contacts having respective contact positions,* the method including the steps of:

*forming a layer of photoresist material on a first surface of the semiconductor substrate;*

*removing said photoresist material from areas corresponding to said contact positions to expose said first surface of the semiconductor substrate surface;* applying a first conductive layer [to a] *on remaining photoresist material and on said exposed* first surface of the semiconductor substrate;

applying a second conductive layer to form a plurality of contiguous layers of conductive materials *on remaining photoresist material and on said exposed first surface of the semiconductor substrate*, said plurality of contiguous layers including said first conductive layer;

selectively removing parts of said plurality of contiguous layers *overlying said remaining photoresist material by removing said remaining photoresist material* so as to form *from remaining conductive material* said conductive contacts, the conductive contacts defining one or more radiation detector cells in the semiconductor substrate*, wherein each conductive contact comprises a first surface adjacent the semiconductor substrate, and a second, exposed surface*; [and]

forming a layer of passivation material on said *exposed surfaces of the* conductive contacts and the regions [around] *between said* conductive contacts;

*forming a further layer of photoresist material over said passivation layer;*

*removing portions of the further photoresist layer to expose portions of the passivation material overlying said conductive contacts;* [and]

removing*, using a passivation etchant,* portions of said passivation material overlying said conductive contacts to expose the conductive contacts*, such that the passivation material remains in the regions between said conductive contacts; and*

*removing remaining further photoresist material.*

2. A method according to claim 1, including applying a third *conductive* layer between said first and second *conductive* layers[, said third layer being a conductive layer].

3. A method according to claim 1, including applying a further *conductive* layer to the second *conductive* layer[, said further layer being a conductive layer].

[4. A method according to claim 1, including:

forming a layer of photoresistive material on said substrate surface;

selectively exposing said photoresistive material and removing said photoresistive material from areas corresponding to said contact positions to expose said semiconductor substrate surface;

forming at least said first and second layers of conductive material on remaining photoresistive material and on said exposed semiconductor substrate surface; and removing conductive material overlying said remaining photoresistive material by removing said remaining photoresistive material.]

[5. A method according to claim 1, wherein the step of removing portions of said passivation material overlying said conductive contacts to expose the conductive contacts comprises:

forming a further layer of photoresistive material over said passivation layer;

selectively exposing said further layer of photoresistive material and removing said further photoresistive material to expose portions of said passivation layer corresponding to said contact positions;

removing said exposed portions of passivation material; and removing remaining further photoresistive material.]

6. A method according to claim [5] *1*, wherein said portions of said passivation layer are removed from areas smaller than the size of said conductive contacts such that the passivation layer overlaps said conductive contacts.

7. A method according to claim 1, wherein each of said first and second *conductive* layers is applied by sputtering, evaporation, electrolytic deposition, or electroless deposition.

8. A method according to claim 1, including forming a layer of conductive material on a surface of said substrate opposite to said first surface.

9. A method of manufacturing a radiation imaging device comprising:

manufacturing a radiation detector in accordance with claim 1; and individually connecting individual detector cell contacts for respective detector cells to corresponding circuits on a readout chip.

[10. A method of manufacturing a radiation detector having one or more conductive contacts on a semiconductor substrate, the method including the steps of:

applying a first conductive layer to a first surface of the semiconductor substrate;

applying a second conductive layer to form a plurality of contiguous layers of conductive materials, said plurality of contiguous layers including said first conductive layer;

selectively removing parts of said plurality of contiguous layers so as to form said conductive contacts, the conductive contacts defining one or more radiation detector cells in the semiconductor substrate;

forming a layer of photoresistive material on said substrate surface;

selectively exposing said photoresistive material and removing said photoresistive material from areas corresponding to said contact positions to expose said semiconductor substrate surface;

forming at least said first and second layers of conductive material on remaining photoresistive material and on said exposed semiconductor substrate surface; and removing conductive material overlying said remaining photoresistive material by removing said remaining photoresistive material.]

[11. A method according to claim 10, including applying a third layer between said first and second layers, said third layer being a conductive layer.]

[12. A method according to claim 10, including applying a further layer to the second layer, said further layer being a conductive layer.]

[13. A method according to claim 10, including forming a layer of passivation material on said conductive contacts and the regions around conductive contacts; and removing portions of said passivation material overlying said conductive contacts to expose the conductive contacts.]

[14. A method according to claim 13, wherein the step of removing portions of said passivation material overlying said conductive contacts to expose the conductive contacts comprises:

forming a further layer of photoresistive material over said passivation layer;

selectively exposing said further layer of photoresistive material and removing said further photoresistive material to expose portions of said passivation layer corresponding to said contact positions;

removing said exposed portions of passivation material; and removing remaining further photoresistive material.]

[15. A method according to claim 14, wherein said portions of said passivation layer are removed from areas smaller than the size of said conductive contacts such that the passivation layer overlaps said conductive contacts.]

[16. A method according to claim 10, wherein each of said first and second layers is applied by sputtering, evaporation, electrolytic deposition, or electroless deposition.]

[17. A method according to claim 10, including forming a layer of conductive material on a surface of said substrate opposite to said first surface.]

[18. A method of manufacturing a radiation imaging device comprising:

manufacturing a radiation detector in accordance with claim 10; and individually connecting individual detector cell contacts for respective detector cells to corresponding circuits on a readout chip.]

*19. A method according to claim 1, wherein the first conductive layer is a contact layer formed adjacent to the substrate, and the second conductive layer is a diffusion barrier layer.*

*20. A method according to claim 1, wherein the length of the first surface of the conductive contact in a direction parallel to the plane of the substrate is greater than the length of the second surface of the conductive contact in said direction, whereby each conductive contact is provided with a substantially trapezoidal cross-section.*

*21. A method according to claim 1, wherein the first conductive layer is formed adjacent to the substrate surface, the first conductive layer comprising platinum.*

*22. A method according to claim 2, wherein the third conductive layer comprises gold.*

*23. A method according to claim 1, wherein the second conductive layer comprises nickel.*

*24. A method according to claim 3, wherein the further conductive layer comprises gold.*

*25. A method according to claim 1, wherein the step of forming a layer of photoresist material on said substrate surface includes applying photoresist material to all exposed surfaces.*

* * * * *